United States Patent [19]

Kaizer

[11] Patent Number: 4,741,040

[45] Date of Patent: Apr. 26, 1988

[54] BASS-REFLEX LOUDSPEAKER SYSTEM

[75] Inventor: Adrianus J. M. Kaizer, Eindhoven, Netherlands

[73] Assignee: U.S. Philips Corporation, New York, N.Y.

[21] Appl. No.: 73,885

[22] Filed: Jul. 10, 1987

Related U.S. Application Data

[63] Continuation of Ser. No. 872,773, Jun. 10, 1986, abandoned.

[30] Foreign Application Priority Data

Jun. 14, 1985 [NL] Netherlands ........................ 8501719

[51] Int. Cl.[4] ........................................... H03G 5/00

[52] U.S. Cl. ....................................... 381/103; 381/96; 381/59

[58] Field of Search ..................... 381/90, 96, 98, 103, 381/117, 59

[56] References Cited

U.S. PATENT DOCUMENTS

| | | | |
|---|---|---|---|
| 4,395,588 | 7/1983 | Franssen et al. | 381/96 |
| 4,462,112 | 7/1984 | Watanabe | 381/90 |
| 4,649,565 | 3/1987 | Kaizer | 381/90 |

*Primary Examiner*—Forester W. Isen
*Attorney, Agent, or Firm*—David R. Treacy; Bernard Franzblau

[57] ABSTRACT

A bass-reflex loudspeaker system in which, by the addition of a corrective network (7) to an arrangement of a transducer (1) accommodated in a bass-reflex enclosure (2), which transducer is dimensioned such that it cannot be bass-reflexed by means of the bass-reflex enclosure, it is possible to simulate a set-up of an imaginary transducer which is housed in the said bass-reflex enclosure and which has a much greater frequency range $H_f(f)$ than the aforesaid arrangement.

2 Claims, 4 Drawing Sheets

BASS-REFLEX LOUDSPEAKER SYSTEM

Figure 1:
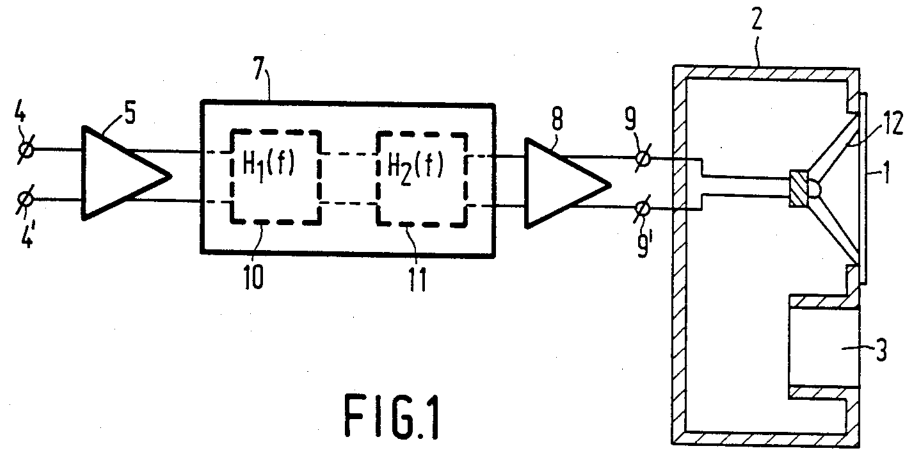

This is a continuation of application Ser. No. 872,773, filed June 10, 1986, now abandoned.

The invention relates to an arrangement for the conversion of an electrical signal into an acoustic signal, with an electro-acoustic transducer installed in a housing. It is known that electro-acoustic transducers may be accommodated in a closed housing. For that purpose such transducers are designed so that, when installed in the closed housing, they possess a quality factor greater than 0.85 and preferably about 1. The arrangement has a frequency range extending from a certain lower-limit frequency $f_o$ to a certain upper-limit frequency $f_b$.

If it is desired to use this arrangement to reproduce lower-frequency signals, by which are meant signals with frequencies located (just) under the lower-limit frequency of the set-up, this can be achieved by connecting at its input a filter which boosts these low frequencies. This boosting of low frequencies may have the result of causing stroke problems in the transducer. This means that the movement of the moving part of the transducer is limited by its maximum possible deflection, so that the acoustic signal is seriously distorted.

It is known from the literature that extension of the frequency range to lower frequencies can be achieved by application of the bass-reflex principle, whereby the stroke of the transducer is considerably smaller in a frequency range immediately below the lower limit of the operating frequency range than the stroke of a transducer in a sealed enclosure and having the same frequency characteristic. The bass-reflex principle is described exhaustively by A. N. Tiele—see J.A.E.S. 19-5, pp. 382 ff. and 19: 6, pp. 471 ff. (1971)—and by R. H. Small—see J.A.E.S. 21: 5, pp. 363 ff., 21: 6, pp. 438 ff.; 21: 7, pp. 549 ff.; and 21: 8, pp. 635 ff. (1973). It is, however, not possible to apply the bass-reflex principle to the known arrangement, namely for the following reason: To be able to apply the bass-reflex principle in the known arrangement, the transducer in the closed housing would have to have a quality factor smaller than 0.75 and preferably approx. 0.6 to 0.7.

To achieve such a value (lowering) of the quality factor there are two measures, among others, which can be taken:

(a) increasing the volume of the enclosure;

(b) using another loudspeaker with a heavier magnetic system (larger Bl product).

In a number of applications—think, for example, of loudspeakers for use in a car—a large enclosure volume is not possible. Moreover, a loudspeaker with a heavier magnetic system is also much more expensive, so that both measures have generally to be rejected.

The invention is aimed at providing an arrangement for converting an electrical signal into an acoustic signal whereby these low frequencies can nevertheless be produced in the said small housing and with the said transducers with a light(er) magnetic system. To that end the arrangement according to the invention is characterised in that the housing is a bass-reflex enclosure and comprises an opening so that the transducer, if accommodated in the aforesaid enclosure with its opening closed, possesses a quality factor greater than 0.85, and means connecting at its input a corrective network whose frequency characteristic corresponds to the frequency characteristic of the transmission of the series connection of a first network and a second network in which the frequency characteristic of the first network is at least approximately the inverse of the frequency characteristic of transmission from the input of the transducer to the acceleration of the diaphragm of the transducer housed in the bass-reflex-enclosure and the frequency characteristic of the second network corresponds at least approximately to the frequency characteristic of the transmission of an imaginary converter which, if accommodated in the said enclosure with its opening closed, has a quality factor which is smaller than 0.75.

The bass-reflex principle is thus nevertheless applied to the said transducer with a quality factor which is greater than 0.85 in the sealed enclosure, despite the fact that this transducer cannot be bass-reflexed in the said enclosure with its relatively small volume. This measure by itself proves not to yield any extension of the operating frequency range towards lower frequencies.

In order now, nevertheless, using this combination of the said transducer in the said housing which is now provided with a port, to simulate a correctly dimensioned bass-reflex system which possesses a much lower limit frequency for the operating frequency range, a corrective network is connected at the transducer input.

As stated, the corrective network can be thought of as being made up from the series connection of a first and a second network. The first network has a frequency characteristic which is at least approximately the reciprocal of the frequency characteristic of the transmission from the input voltage of the transducer to the acceleration of the diaphragm of the transducer as installed in the said housing with a port or a passive radiator. Since the acceleration of the diaphragm is a measure of the acoustic output signal from the arrangement, the connection of the first network at its input has the consequence that the transmission from the input of the filter to the output of the transducer (by which is meant the acoustic output signal from the transducer) becomes more or less flat over a large frequency range. By then connecting the second network to the input the behaviour of an imaginary transducer is in fact simulated which can indeed be bass-reflexed in the said enclosure, so that a total transmission of the electrical input signal of the arrangement to the acoustic output signal from the arrangement is achieved which can be used over a much larger frequency range, particularly in the direction of lower frequencies.

By connecting the corrective network at the input it has thus been possible to achieve a transmission which could also have been achieved by placing the said loudspeaker in a larger housing or by placing in the said housing a loudspeaker with a heavier magnetic system. As already observed, a larger enclosure volume is not always possible. Furthermore, a larger housing or a loudspeaker with a heavier magnetic system makes the arrangement more expensive. The cost which this would necessitate is generally higher than the cost of embodying the corrective network since such a corrective network can, if desired, be integrated. The arrangement according to the invention thus has the advantage that the price of such an arrangement with a large operating frequency range can be lower than that of arrangements which achieve the same operating frequency range in another manner.

It should be stated here where mention is made above or will be made below of a bass-reflex enclosure, what is meant is: either a housing with an open (or acoustic)

port or a housing in which a passive radiator is mounted in an opening.

Systems with a passive radiator are described by, among others, R. H. Small in J.A.E.S. 22: 8, pp. 592 ff., and 22: 9, pp. 683 ff. (1974).

Where mention is made above or will be made below of a closed opening in the housing, what is meant is that the port or the passive radiator makes no acoustic contribution. This means that the port is completely shut off and, in the form of the embodiment with the passive radiator, that this radiator cannot move.

Figure 2A:
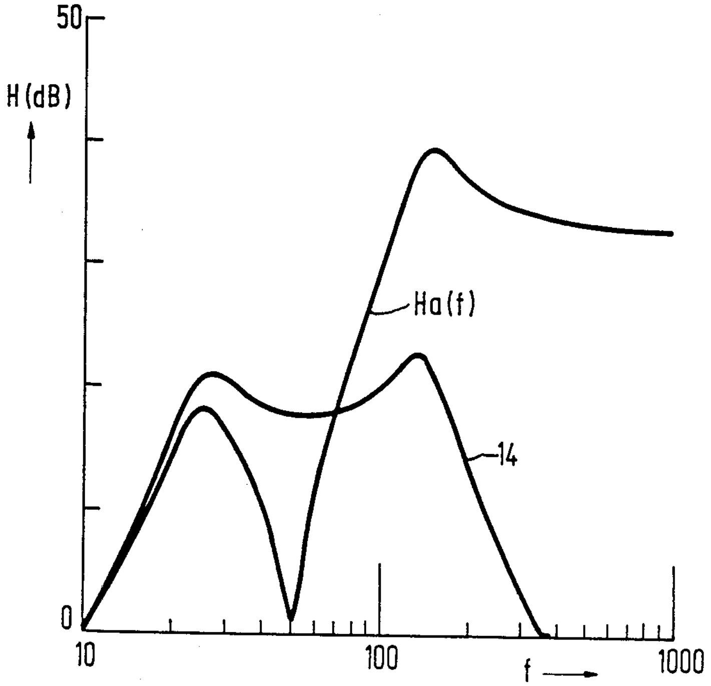
Figure 2B:
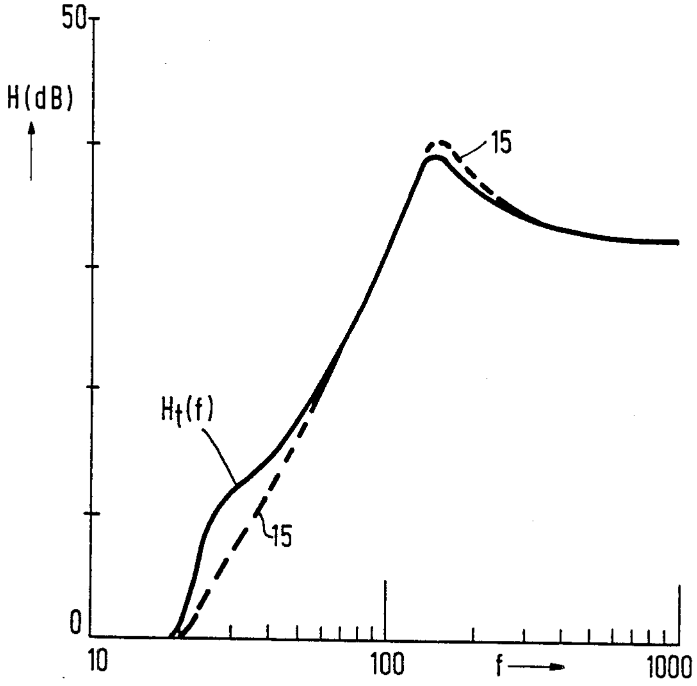
Figure 3:
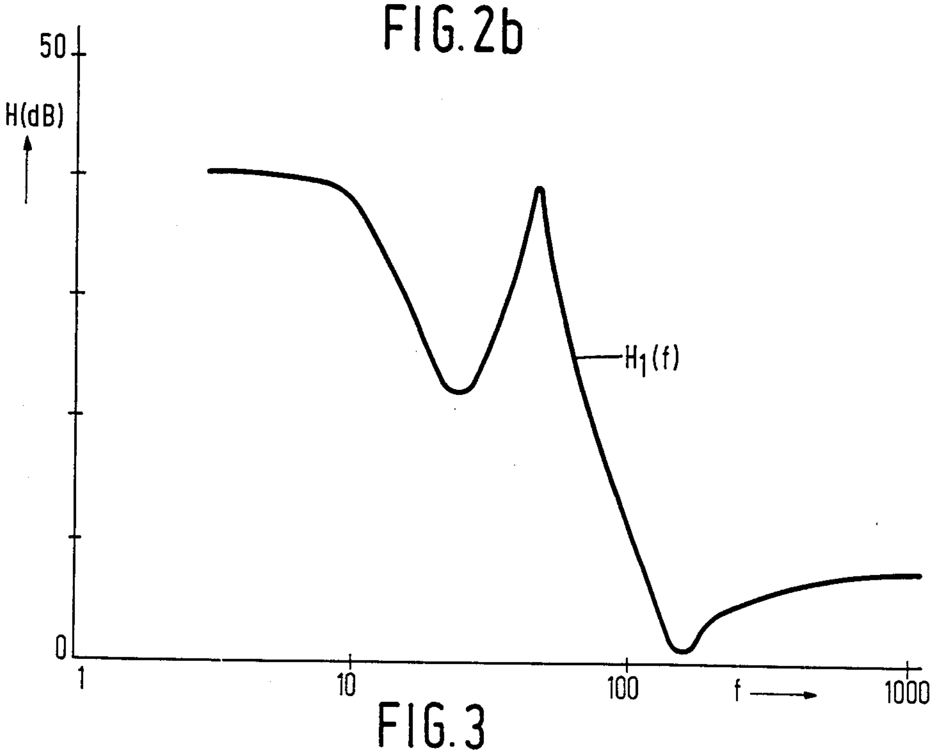
Figure 4A:
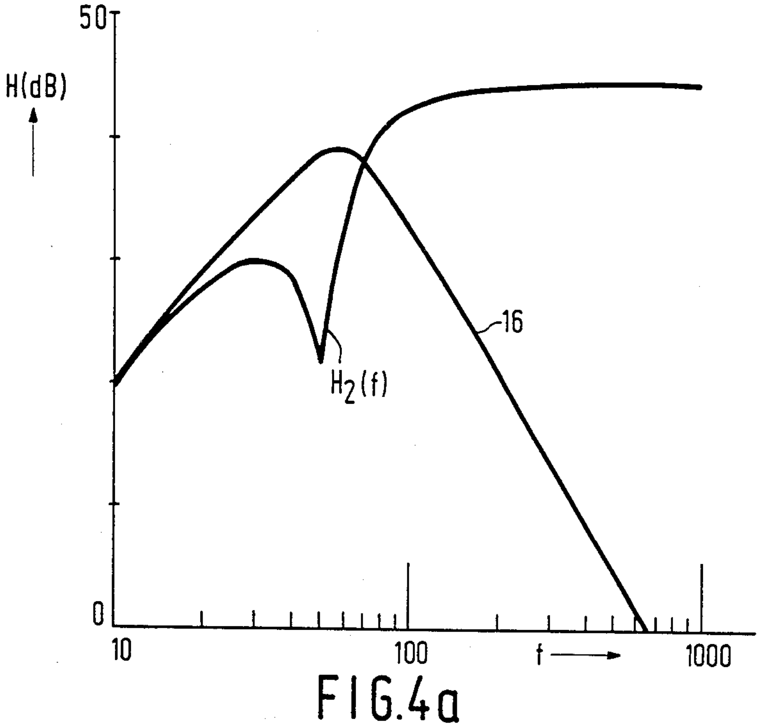
Figure 4B:
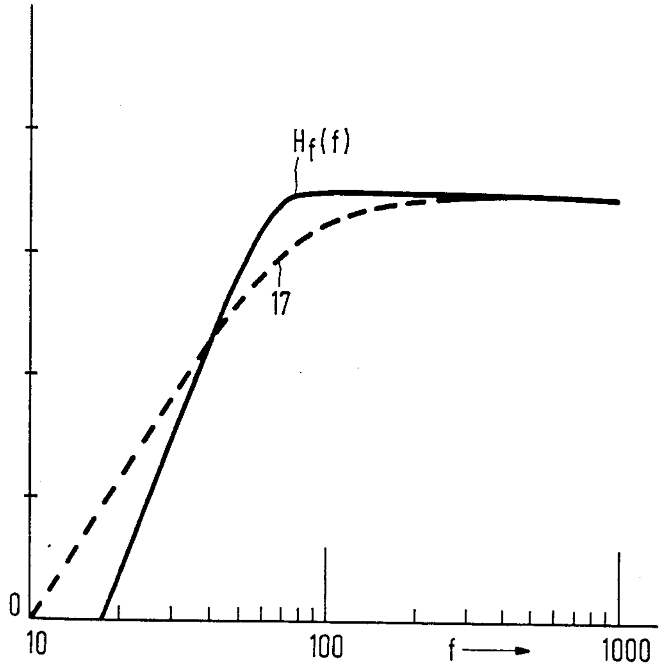
Figure 5:
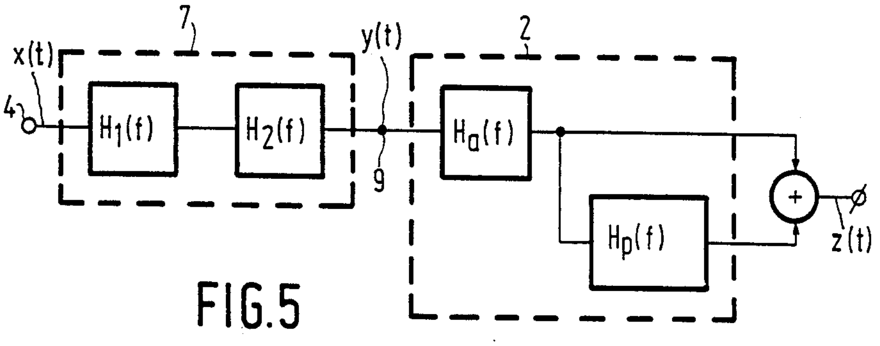
Figure 6:
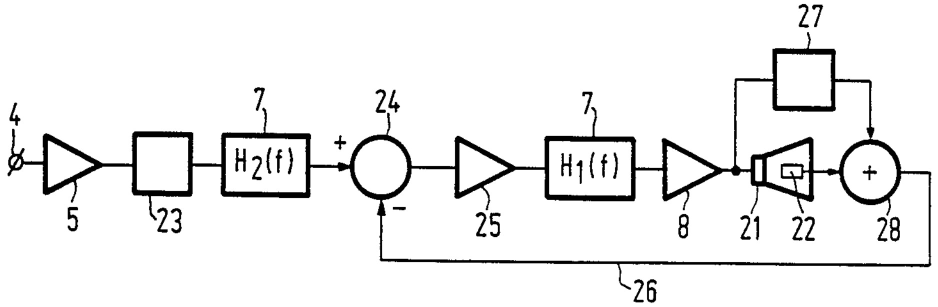
Figure 7:
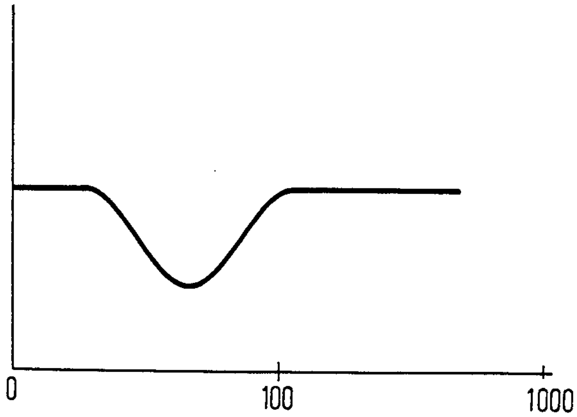

The invention will now be explained in greater detail with reference to the accompanying drawing, which illustrate the following:

FIG. 1: an example of a form of embodiment of the arrangement according to the invention, FIGS. 2*a* and 2*b* show some frequency characteristics associated with the arrangement, FIG. 3: the frequency characteristic of the first network, FIGS. 4*a* and 4*b:* some frequency characteristics associated with an arrangement in which an imaginary transducer is installed in the housing of the arrangement according to the invention, FIG. 5: a block diagram of the arrangement in FIG. 2, FIG. 6: a second embodiment, and FIG. 7: a frequency characteristic of a network in the form of the embodiment in FIG. 6.

FIG. 1 shows a first embodiment of the arrangement. An electro-acoustic transducer 1, shown only schematically, is mounted in a housing 2. The housing is shown in cross-section. Also visible is the bass-reflex port 3. The transducer 1 and the housing 2 are dimensioned such that the transducer 1 in this housing 2 has, if port 3 is shut off, a quality factor Q which is greater than 0.85.

The quality factor of the transducer 1 is defined as follows:

$$Q = \frac{1}{R_m + \frac{(Bl)^2}{R_e}} \sqrt{m(k_1 + k_b)} \qquad (1)$$

where:

$R_m$ = the mechanical resistance of the mass spring system formed by the diaphragm (the cone) of the transducer unit and its suspension [$^{Ns}/$m], $R_e$ = the electrical resistance of the voice coil [Ω], B = the magnetic induction of the air gap [$^{Wb}/$m$^2$], l = the length of the turns of the voice coil in so far as in the air gap [m], m = the mass of the diaphragm, the voice coil and the voicecoil former and the air load [kg], $k_1$ = the spring constant of the suspension of the diaphragm [N/m], and $k_b$ = the spring constant resulting from the volume of air behind the diaphragm of the enclosure.

It has been assumed here that the transducer is an electrodynamic transducer.

The input terminals of the arrangement 4, 4′ are coupled to the input 9, 9′ of the housing 2 via a preamplifier 5, a corrective network 7 and a power amplifier 8. The corrective network 7 has a transmission frequency characteristic $H_c(f)$ that corresponds to the transmission characteristic of the series connection of a first network 10 and a second network 11 The first network 10 has a transmission characteristic $H_1(f)$ which is at least approximately the inverse of the transmission $H_a(f)$ from the input 9, 9′ of transducer 1 to the acceleration of diaphragm 12 of transducer 1 fitted in housing 2 with bass-reflex port 3, i.e.

$$H_1(f) = \frac{1}{H_a(f)} \qquad (2)$$

FIG. 2*a* shows the transmission $H_a(f)$ of transducer 1 in the bass-reflex enclosure 2. Since the acceleration of the diaphragm 12 is a measure of the sound pressure caused by the transducer 1, this characteristic shows the contribution of the transducer to the acoustic output signal (the sound pressure) of the bass-reflex enclosure. FIG. 2*a* further shows by means of curve 14 the transmission from the input 9, 9′ of the transducer to the volume velocity of the port. This curve consequently shows the contribution of port 3 to the acoustic output signal (the sound pressure) of enclosure 2. The curves in FIG. 2*a* and the figures which follow were obtained by means of computer simulations and show only the low-frequency behaviour (below 1000 Hz) of the various components. The frequency has been plotted logarithmically along the horizontal axis and the amplitudes of the transmissions in (relative) dB's along the vertical axis.

FIG. 2*b* shows the total transmission $H_t(f)$ of the bass-reflex enclosure 2 obtained by adding together $H_a(f)$ and curve 14 from FIG. 2*a*. Also indicated by the broken line in FIG. 2*b* is the transmission from the loudspeaker 1 in the housing 2, but with the port 3 shut off. It will be clear from FIG. 2*b* that the transducer 1 cannot be bass-reflexed by means of bass-reflex enclosure 2. The incorporation of the port 3 does not give rise to any increase in the frequency range in the direction of lower frequencies. The characteristics shown in FIGS. 2*a* and 2*b* are indicative of a system for a bass-reflex system in which the enclosure is really too small for the loudspeaker that is used.

FIG. 3 shows the transmission $H_1(f)$ which satisfies formula (2). The curve $H_1(f)$ is the reciprocal of the curve $H_a(f)$ in FIG. 2*a*. For frequencies lower than 10 to 20 Hz the curve is allowed to move horizontally or to drop. This is because there is no point in making the characteristic $H_1(f)$ rise any further in this range, on the one hand, because hearing extends down to about 20 Hz and, on the other, because problems can arise with regard to the dynamic range of the arrangement.

The second network 11 has a transmission characteristic $H_2(f)$ which corresponds at least approximately to the transmission of an imaginary transducer which, if incorporated in the bass-reflex enclosure 2 with its opening 3 shut off, has a quality factor which is smaller than 0.75. This really means that this imaginary loudspeaker can be correctly bass-reflexed with housing 2. The behaviour of the imaginary system in which the imaginary loudspeaker is enclosed in housing 2 is reproduced in FIG. 4.

FIG. 4*a* shows this transmission characteristic $H_2(f)$. The curve shows the transmission characteristic from the input of the imaginary transducer to the acceleration of the diaphragm of the imaginary transducer. This characteristic shows, as already stated with reference to FIG. 2*a*, the contribution of the imaginary transducer to the acoustic output signal of the imaginary system. Similarly, curve 16 shows the contribution of port 3 to the acoustic output signal from the imaginary system.

FIG. 4b shows the transmission $H_f(f)$ from the imaginary system and the broken line 17 the transmission from the imaginary loudspeaker in the enclosure 2 with the port 3 shut off. It is clear from FIG. 4b that the imaginary loudspeaker in the bass-reflex enclosure 2 achieves an obviously greater frequency range, i.e. a characteristic extending down to lower frequencies. If we compare FIGS. 2b and 4b with each other, it is clear that the lower-limit frequency (the −3 dB point) in this form of embodiment has been shifted from about 100 Hz to about 60 Hz.

The question now is what the transmission of the set-up in FIG. 1 looks like. To that end the set-up in FIG. 1 has been transformed to an equivalent electrical diagram in FIG. 5. Amplifiers 5 and 8 have been omitted in this process. The signals x(t), y(t) and z(t) are respectively the electrical input signals offered to terminals 4, 4', the electrical input signal offered to terminals 9, 9' of housing 2 and the acoustic output signal from the housing which is obtained by the summation of the acoustic contributions of transducer 1 and port 3. After a Fourier transformation in which x(t), y(t), and z(t) respectively transform to X(f), Y(f) and Z(f), the following formulae apply:

$$Z(f)=[H_a(f)+H_a(f)H_p(f)]Y(f) \quad (3)$$

and $$Y(f)=H_1(f)H_2(f)X(f) \quad (4)$$

Making use of formula (2), formula (4) becomes:

$$Y(f)=\frac{H_2(f)}{H_a(f)}X(f) \quad (5)$$

By combining formulae (3) and (5) we find:

$$Z(f)=[H_2(f)+H_2(f)H_p(f)]X(f) \quad (6)$$

Formula (6) indicates that the arrangement of FIG. 1 behaves like the imaginary system described with reference to FIG. 4, with a total transmission of $H_f(f)$, or:

$$Z(f)=H_f(f)X(f) \quad (7)$$

It should also be stated here by way of clarification that curves 14 and 16 correspond respectively to the transmissions $H_a(f)H_p(f)$ and $H_2(f)H_p(f)$.

FIG. 6 shows a second embodiment in which the motional-feedback principle has been applied to the embodiment shown in FIG. 1. To that end the transducer 21 has been fitted with an acceleration transducer 22 attached to the diaphragm. The electrical input signal is applied to transducer 21 via the input terminal 4 and the series connection of a pre-amplifier 5, a network 23, the second network $H_2(f)$, and adder unit 24, an amplifier 25, the first network $H_1(f)$ and the amplifier 8. The output signal from transducer 22 is supplied to the adder unit 24 via the feedback chain 26. If required, there is also included a transfer network 27 which electrically bridges the transducer 21 and the transducer 22.

The purpose of and the lay-out of such a transfer network have been described in the U.S. Pat. No. 4,395,588. Transducer 22 would have to be a measure of the acoustic power output of the set-up (transducer 22 plus a port or passive radiator). Since transducer 22 is only a measure of the acoustic power output of just converter 22, network 23, which has a characteristic such that it corrects for the absence of the port or passive radiator's contribution in the transducer signal, has been added. The frequency curve for network 23 is shown in FIG. 7.

Should the opening in the housing of the embodiment in FIG. 6 be fitted with a passive radiator, a vibration transducer can also be fitted on this passive radiator and the signals of both transducers taken to the adder unit 28. In that case network 23 can be omitted.

What is claimed is:

1. An arrangement for the conversion of an electrical signal into an acoustic signal, comprising an electro-acoustic transducer fitted in a housing, characterised in that the housing is a bass-reflex enclosure and comprises an opening so that the transducer, if accommodated in the aforesaid enclosure with its opening closed, possesses a quality factor greater than 0.85, and means connecting at its input a corrective network whose frequency characteristic corresponds to the frequency characteristic of the transmission of the series connection of a first network and a second network in which the frequency characteristic of the first network is at least approximately the inverse of the frequency characteristic of transmission from the input of the transducer to the acceleration of the diaphragm of the transducer housed in the bass-reflex-enclosure and the frequency characteristic of the second network corresponds at least approximately to the frequency characteristic of the transmission of an imaginary converter which, if accommodated in the said enclosure with its opening closed, has a quality factor which is smaller than 0.75.

2. An arrangement as claimed in claim 1, characterized in that a passive radiator is mounted in the opening.

* * * * *